US008121848B2

(12) United States Patent
Monro

(10) Patent No.: US 8,121,848 B2
(45) Date of Patent: Feb. 21, 2012

(54) BASES DICTIONARY FOR LOW COMPLEXITY MATCHING PURSUITS DATA CODING AND DECODING

(75) Inventor: Donald M. Monro, Somerset (GB)

(73) Assignee: Pan Pacific Plasma LLC, Wilmington, DE (US)

( * ) Notice: Subject to any disclaimer, the term of this patent is extended or adjusted under 35 U.S.C. 154(b) by 485 days.

(21) Appl. No.: 11/378,662

(22) Filed: Mar. 17, 2006

(65) Prior Publication Data

US 2007/0052558 A1    Mar. 8, 2007

Related U.S. Application Data

(60) Provisional application No. 60/715,998, filed on Sep. 8, 2005.

(51) Int. Cl.
*G10L 19/00* (2006.01)
*G10L 21/04* (2006.01)
(52) U.S. Cl. ........ 704/500; 704/501; 704/502; 704/503; 704/504
(58) Field of Classification Search .................. 704/500, 704/203
See application file for complete search history.

(56) References Cited

U.S. PATENT DOCUMENTS

| 5,315,670 | A | 5/1994 | Shapiro |
| 5,321,776 | A | 6/1994 | Shapiro |
| 5,412,741 | A | 5/1995 | Shapiro |
| 5,495,292 | A | 2/1996 | Zhang et al. |
| 5,585,852 | A | 12/1996 | Agarwal |
| 5,699,121 | A | 12/1997 | Zakhor et al. |
| 5,768,437 | A | 6/1998 | Monro et al. |
| 6,078,619 | A | 6/2000 | Monro et al. |
| 6,148,106 | A | 11/2000 | Impagliazzo |

(Continued)

FOREIGN PATENT DOCUMENTS

GB    2409943    7/2005

(Continued)

OTHER PUBLICATIONS

R. Neff, A. Zakhor, and M. Vetterli, "Very low bit rate video coding using matching pursuits," Proc. SPIE Conf. on Visual Communication and Image Processing Chicago, IL, vol. 2308, pp. 47-60, Sep. 1994.*

(Continued)

*Primary Examiner* — Richemond Dorvil
*Assistant Examiner* — Michael Ortiz Sanchez
(74) *Attorney, Agent, or Firm* — Perkins Coie LLP

(57) ABSTRACT

Embodiments related to utilizing substantially optimal entries for a relatively low complexity dictionary for matching pursuits coding is disclosed. In various embodiments, methods are invoked for determining a substantially optimal entry from a bases dictionary comprising a plurality of entries; and utilizing the substantially optimal entry in a relatively low complexity matching pursuits data coding. In various embodiments, a system is provided comprising a bases dictionary comprising a plurality of entries each with a width of 15 or less; a signal to be coded; and a selection module configured to receive at least one of the plurality of entries from the bases dictionary, to calculate an inner product between the at least one of the plurality of entries and the signal to be coded, and to select the entry from the at least one of the plurality of entries that produces a maximum inner product for use in at least partially coding the signal to be coded. In various embodiments, instructions for the invoked methods are stored in computer-readable media.

41 Claims, 4 Drawing Sheets

U.S. PATENT DOCUMENTS

| | | | |
|---|---|---|---|
| 6,532,265 | B1 | 3/2003 | Van der Auwera et al. |
| 6,556,719 | B1 | 4/2003 | Monro |
| 6,587,507 | B1 | 7/2003 | Chui et al. |
| 6,614,847 | B1 | 9/2003 | Das et al. |
| 6,633,688 | B1 | 10/2003 | Nixon et al. |
| 6,741,739 | B1 | 5/2004 | Vincent |
| 6,757,437 | B1 | 6/2004 | Keith et al. |
| 6,782,132 | B1 | 8/2004 | Fogg |
| 6,795,504 | B1 | 9/2004 | Xu et al. |
| 6,982,742 | B2 | 1/2006 | Adair et al. |
| 6,985,526 | B2 | 1/2006 | Bottreau et al. |
| 6,990,145 | B2 | 1/2006 | Monro et al. |
| 6,990,246 | B1 | 1/2006 | Ferguson |
| 7,003,039 | B2 | 2/2006 | Zakhor et al. |
| 7,006,567 | B2 | 2/2006 | Frossard et al. |
| 7,242,812 | B2 | 7/2007 | Hwang et al. |
| 7,336,811 | B2 | 2/2008 | Takeo |
| 7,436,884 | B2 | 10/2008 | Chen et al. |
| 7,447,631 | B2* | 11/2008 | Truman et al. ............... 704/230 |
| 7,548,656 | B2 | 6/2009 | Nakajima et al. |
| 2002/0131497 | A1* | 9/2002 | Jang ..................... 375/240.11 |
| 2003/0103523 | A1 | 6/2003 | Frossard et al. |
| 2004/0028135 | A1 | 2/2004 | Monro |
| 2004/0126018 | A1 | 7/2004 | Monro |
| 2004/0165737 | A1 | 8/2004 | Monro |
| 2005/0084014 | A1 | 4/2005 | Wang et al. |
| 2006/0013312 | A1 | 1/2006 | Han |
| 2006/0146937 | A1 | 7/2006 | Ye et al. |
| 2006/0203906 | A1 | 9/2006 | Divorra Escoda et al. |
| 2007/0053434 | A1 | 3/2007 | Monro |
| 2007/0053597 | A1 | 3/2007 | Monro |
| 2007/0053603 | A1 | 3/2007 | Monro |
| 2007/0065034 | A1 | 3/2007 | Monro |
| 2007/0081593 | A1 | 4/2007 | Jeong et al. |

FOREIGN PATENT DOCUMENTS

| | | |
|---|---|---|
| WO | WO98/11730 | 3/1998 |
| WO | WO99/08449 | 2/1999 |
| WO | WO01/15456 | 3/2001 |
| WO | WO01/63935 | 8/2001 |
| WO | WO02/13538 | 2/2002 |
| WO | WO 2004-086302 | 10/2004 |
| WO | WO2005/027049 | 3/2005 |
| WO | WO2005/119581 | 12/2005 |
| WO | WO2007/030702 | 3/2007 |
| WO | WO2007/030784 | 3/2007 |
| WO | WO2007/030785 | 3/2007 |
| WO | WO2007/030788 | 3/2007 |

OTHER PUBLICATIONS

R. Neff and A. Zakhor, "Matching pursuit video coding at very low bit rates," IEEE Data Compression Conference, Mar. 1995, pp. 411-420.*

Marusic, B.; Skocir, P.; Tasic, J., "A matching pursuit enhanced three-dimensional wavelet transform coder," Electrotechnical Conference, 2000. MELECON 2000. 10th Mediterranean, vol. 2, no., pp. 482-485 vol. 2, 2000.*

Chou, Y., Hwang, W., and Huang, C. 2003. Gain-shape optimized dictionary for matching pursuit video coding. Signal Process. 83, 9 (Sep. 2003), 1937-1943.*

Neff, R.; Zakhor, A., "Matching pursuit video coding .I. Dictionary approximation," Circuits and Systems for Video Technology, IEEE Transactions on , vol. 12, No. 1, pp. 13-26, Jan. 2002.*

Neff, R.; Zakhor, A., "Very low bit-rate video coding based on matching pursuits," Circuits and Systems for Video Technology, IEEE Transactions on , vol. 7, No. 1, pp. 158-171, Feb. 1997.*

Monro et al., "Bases for Low Complexity Matching Pursuits Image Coding" www.http://dmsun4.bath.ac.uk.

Yuan et al., "Improved Matching Pursuits Image Coding" IEEE International Conference on Acoustics, Speech and Signal Processing ICASSP 2005, pp. II-201-204, Mar. 2005.

Monro, "Basis Picking for Matching Pursuits Image Coding" IEEE International Conference on Image Processing, pp. 2495-2498, Sep. 2004.

Yuan et al., "Low Complexity Separable Matching Pursuits" IEEE Int. Conference Acoustics Speech Signal Process, pp. III-725-728, May 2004.

U.S. Appl. No. 11/255,090, filed Oct. 19, 2005, Monro.

Figueras et al., "Color Image Scalable Coding with Matching Pursuit" IEEE Int. Conference Acoustics Speech Signal Process, pp. III-53-56, May 2004.

Monro et al., "Improved Coding of Atoms in Matching Pursuits" IEEE Int. Conf. Image Process, vol. 2, Sep. 2003.

Frossard et al., "High Flexibility Scalable Image Coding" Proceedings of VCIP 2003, Jul. 2003.

Poh et al., "Comparison of Residual Compression Methods in Motion Compensated Video" IEEE Int. Workshop on Multimedia Signal Processing, pp. 109-112, Dec. 2002.

Moschetti et al., "New Dictionary and Fast Atom Searching Method for Matching Pursuit Representation of Displaced Frame Difference" IEEE International Conference on Image Processing, pp. III-685-688, Sep. 2002.

Neff et al., "Matching Pursuit Video Coding—Part I: Dictionary Approximation" IEEE Trans. Circuits System Video Technology, vol. 12, No. 1, pp. 13-26, Jan. 2002.

Tredwell et al., "A Sequential Vector Selection Algorithm for Controllable Bandwidth Motion Description Encoding" IEEE Sympos. Intell. Multimedia. Video & Speech Process, May 2001.

Czerepinski et al., "Matching Pursuits Video Coding: Dictionaries and Fast Implementation" IEEE Trans Circuit Systems Video Technology, vol. 10, No. 7, pp. 1103-1115, Oct. 2000.

Monro et al., "Visual Embedding of Wavelet Transform Coefficients" IEEE International Conference Image Process, pp. 186-189, Sep. 2000.

Neff et al., "Very Low Bit-Rate Video Coding Based on Matching Pursuits" IEEE Trans. Circuits and Systems for Video Tech., vol. 7, No. 1, pp. 158-171, Feb. 1997.

Mallat et al., "Matching Pursuits with Time-Frequency Dictionaries" IEEE Trans. Signal Processing, vol. 41, No. 12, pp. 3397-3415, Dec. 1993.

Steffen et al., "Theory of Regular $M$-band Wavelet Bases" IEEE Transactions on Signal Processing, vol. 41, No. 12, pp. 3497-3511, Dec. 1993.

Shapiro, "Embedded Image Coding Using Zerotrees of Wavelet Coefficients" IEEE Transactions on Signal Processing, vol. 41, No. 12, pp. 3445-3462, Dec. 1993.

Ramchandran et al., "Best Wavelet Packet Bases in a Rate-Distortion Sense" IEEE Transactions on Signal Processing, vol. 2, No. 2, pp. 160-175, Apr. 1993.

Mallat, "A Theory for Multiresolution Signal Decomposition: The Wavelet Representation" IEEE Trans. Pattern Anal. Mach. Intel., vol. 11, No. 7, Jul. 1989.

Daubechies, "Orthonormal Bases of Compactly Supported Wavelets" Comm. Pure Appl. Math., vol. 41, pp. 909-996, 1988.

Chan et al., "Multiple Description and Matching Pursuit Coding for Video Transmission Over the Internet," IEEE International Conference on Acoustics, Speech, and Signal Processing, Apr. 2003, vol. 3, pp. 425-428.

Ohm J-R et al. "Interframe Wavelet Coding—Motion Picture Representation for Universal Scalability", Signal Processing. Image Communication, Elsevier Science Publishers, Amsterdam, NL, Oct. 1, 2004, vol. 19, No. 9, pp. 877-908.

Adel Rahmoune et al., "Scalable Motion Adaptive Video Coding with Redundant Representation", PCS 2004, Dec. 15, 2004 (5 pages).

Escoda O D et al., "A Bayesian Approach to Video Expansions on Parametric Over-Complete 2-D Dictionaries", Multimedia Signal Processing, 2004 IEEE 6th Workshop on Siena, Italy, Sep. 29-Oct. 1, 2004, Piscataway, NJ, USA, Sep. 29, 2004, pp. 490-493.

Yuan Yuan et al., "3D Wavelet Video Coding with Replicated Matching Pursuits", Image Processing, 2005, Sep. 11, 2005, vol. 1, pp. 69-72.

Mark Banham et al., "A Selective Update Approach to Matching Pursuits Video Coding", IEEE Transactions on Circuits and Systems for Video Technology, IEEE Service Center, Piscataway, NJ, US, vol. 7, No. 1, Feb. 1, 1997 (11 pages).

David W. Redmill et al., "Video Coding Using a Fast Non-Separable Matching Pursuits Algorithm", Image Processing, 1998.ICIP 98.1998 International Conference on Chicago, IL, USA, Oct. 4-7, 1998, Oct. 4, 1998, pp. 769-773.

P. Vera-Candeas, et al., "New Matching Pursuit Based Sinusoidal Modelling Method for Audio Coding", IEE Proceedings: Vision, Image and Signal Processing, Institution of Electrical Engineers, Feb. 5, 2004, vol. 151, No. 1, pp. 21-28.

Zhixiong Wu et al., "Block Based DCT and Wavelet Selective Coding", ITU Study Group 16—Video Coding Experts Group, Jun. 30, 1996 (9 pages).

* cited by examiner

BASES DICTIONARY FOR LOW COMPLEXITY MATCHING PURSUITS DATA CODING AND DECODING

RELATED APPLICATION

This patent application claims priority to U.S. Provisional Patent Application Ser. No. 60/715,998, titled "BASIS DICTIONARY FOR LOW COMPLEXITY MATCHING PURSUITS DATA CODING AND DECODING," filed on Sep. 8, 2005, by Donald M. Monro.

BACKGROUND

Digital video and audio services such as transmitting signals, digital images, digital video, and/or audio information over wireless transmission networks, digital satellite services, streaming video and/or audio over the Internet, delivering video content to personal digital assistants or cellular phones, and other devices, are increasing in popularity. Therefore data compression and decompression techniques that balance visual fidelity with levels of compression to allow efficient transmission and storage of digital content may become more prevalent.

BRIEF DESCRIPTION OF THE DRAWINGS

The claimed subject matter will be understood more fully from the detailed description given below and from the accompanying drawings of embodiments which should not be taken to limit the claimed subject matter to the specific embodiments described, but are for explanation and understanding only.

Figure 1:
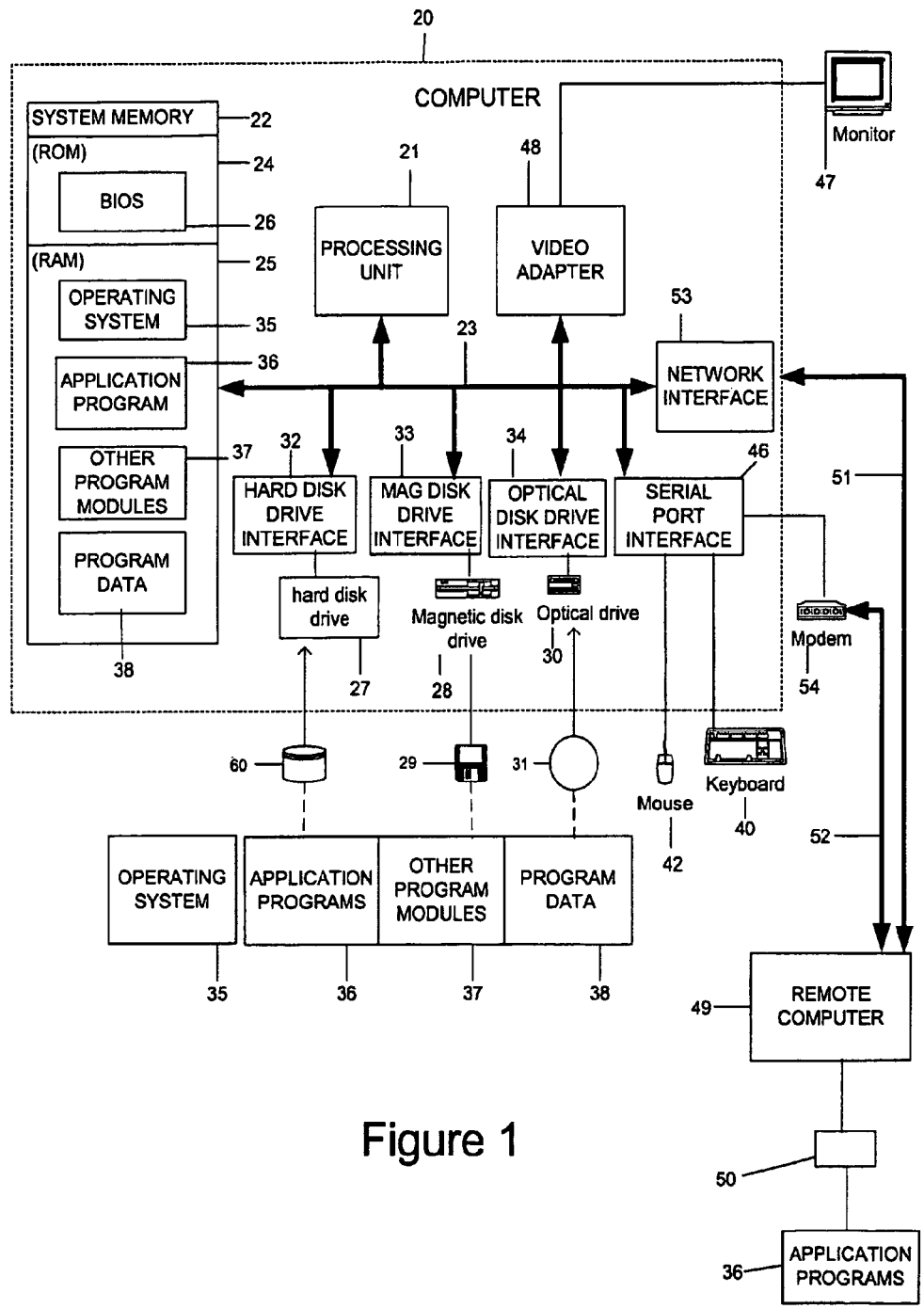
FIG. 1 is a diagram of a system according to an embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Matching pursuits processes may be used to compress one or multidimensional data, including but not limited to still images, audio, video, and/or digital images. A matching pursuits process may include finding a full inner product between a signal to be coded and each member of a dictionary of bases functions. At the position of the maximum inner product the dictionary entry giving the maximum inner product may describe the signal locally. This may be referred to as an "Atom." The amplitude is quantized, and the position, quantized amplitude, sign, and dictionary number form a code describing the Atom. For one embodiment, the quantization may be performed using a precision limited quantization method. Other embodiments may use other quantization techniques.

The Atom is subtracted from the signal giving a residual. The signal may then be completely and/or partially described by the Atom plus the residual. The process may be repeated with new Atoms successively found and subtracted from the residual. At any stage, the signal may be completely described by the codes of the Atoms found and the remaining residual.

Matching pursuits may decompose any signal f into a linear expansion of waveforms that may belong to a redundant dictionary $D=\phi\{\gamma\}$ of bases functions, such that $$f = \sum_{n=0}^{m-1} \alpha_n \varphi_{\gamma_n} + R^m f$$

where $R^m f$ is the $m^{th}$ order residual vector after approximating f by m 'Atoms' and $$\alpha_n = <\phi_{\gamma_n}, R^n f>$$

is the maximum inner product at stage n of the dictionary with the $n^{th}$ order residual.

For some embodiments, the dictionary of bases functions may comprise two-dimensional bases. Other embodiments may use dictionaries comprising one-dimensional bases, which may be applied separately to form two-dimensional bases. A dictionary of n bases functions in one dimension may provide a dictionary of $n^2$ bases functions in two dimensions.

In an embodiment 1D dictionary entries may be defined by a set of parameters which, when substituted into a defining equation, describe the samples of the bases used in the Matching Pursuits Inner Product Calculations. One such description may be $$g_k = \left(\exp\left(\frac{-\pi t^2}{\sigma_k}\right)\right)^{0.25} \cos\left(\frac{\pi f_k t}{w_k} + \phi_k\right)$$

where the dictionary index is k and $t \in [-w_k, \ldots, w_k]$.
Maximum width ('footprint') $(2w_k+1) \in [3,5,7,9,\ldots]$
Bases frequencies $f_k \in [0,1\ldots,w_k]$
Phase shifts $\phi_k \in [(0,0.5,1.0,1.5,2)\pi/4]$
Attenuation factors $\sigma_k \in [1,2,4,8,12,16,20,24]$
The unit impulse (Dirac function) may also be included in the dictionary. Other similar definitions may be utilized without straying from the concepts disclosed herein.

An embodiment of a low complexity 1D Dictionary of 16 bases may be described by the parameters:

| Picked No k | Width d $2w_k + 1$ | Frequency $f_k$ | Phase $(*\pi/4)$ | Attenuation $\sigma_k$ |
| --- | --- | --- | --- | --- |
| 1 | 1 | 0 | 0 | 1 |
| 2 | 5 | 0 | 0 | 8 |
| 3 | 9 | 3 | 1.5 | 2 |
| 4 | 9 | 0 | 0 | 24 |
| 5 | 9 | 1 | 1 | 2 |
| 6 | 3 | 1 | 0 | 2 |
| 7 | 5 | 1 | 2 | 1 |
| 8 | 3 | 0 | 0 | 12 |
| 9 | 7 | 2 | 1.5 | 12 |
| 10 | 7 | 1 | 1.5 | 4 |

-continued

| Picked No k | Width d $2w_k + 1$ | Frequency $f_k$ | Phase $(*\pi/4)$ | Attenuation $\sigma_k$ |
|---|---|---|---|---|
| 11 | 7 | 0 | 0 | 12 |
| 12 | 5 | 2 | 0 | 12 |
| 13 | 9 | 1 | 2 | 8 |
| 14 | 5 | 1 | 1 | 24 |
| 15 | 5 | 1 | 0 | 12 |
| 16 | 9 | 3 | 1 | 2 |

As these bases may be very effective, other bases may be derived from and/or substantially similar to, these and/or similar bases without straying from the spirit and scope of this disclosure. Furthermore, modifications may be made to the disclosed bases to form other substantially similar and/or effective bases. These derivations and changes are intended to be encompassed by this disclosure and/or claims.

Some current matching pursuits dictionaries may include bases as wide as 35 samples. Previously disclosed dictionaries and/or codebooks of matching pursuits bases functions would contain bases of varying widths and other parameters, but invariably contained one or more bases functions of the maximum permitted width, namely 35. This width is a factor that may increase the computational cost of matching pursuits compression. Furthermore, utilizing this width of base introduces challenges as the residual created when subtracting the Atom from the portion of the signal may cause the use of a number of other Atoms to code or "repair" the residual in said portion, thereby increasing the number of Atoms needed, introducing even more computational cost to compress the signal.

One aspect of the complexity of matching pursuits compression may be the "repair" stage, which may depend on the number of bases and their widths. In an embodiment, the number of 1D bases making up the dictionary is b and the maximum bases width or "footprint" is $d=(2w_k+1)$. In 1D, the repair complexity is of order $bd^2$. In 2D, there may be $b^2$ bases and for efficiency, the computation may be done separably, with complexity of order $b^2(d^2+d^3)$, where one consideration is the term $b^2d^3$. Therefore, an aspect depends upon the width $d^3$, meaning that the presence of one or more bases of maximum width, such as 35, in the dictionary will affect the computational cost. In an exemplary embodiment, the maximum width of the bases may be reduced to reduce cost.

This 1D width of 35 makes the maximum area of the corresponding 2D base $35^2$ or 1225 pixels. A 2D dictionary of 20×20 bases and maximum footprint 35 would have a complexity dominated by the term $b^2d^3$ which is $1.7\times10^7$. A smaller maximum width base, such as 14, would only have a 2D area of 196 pixels. Furthermore, a dictionary of size 9×9, with a maximum width base of 14 (15 or less) would only have a 2D area of 81 pixels and complexity dominated by $1.4\times10^5$. The narrower base may involve more Atoms as to the actual signal coding, but much less calculating overall as the complexity of the inner product calculations is greatly reduced.

The number of bases in the dictionary b, or $b^2$ in this embodiment, also creates bit rate savings in the transmission of the basis numbers utilized for coding each Atom. The trade-off may allow more Atoms to be transmitted at a specified bit rate so that fidelity may not be lost and may even be improved. With a transform of the signal and matching pursuits, a relatively low complexity dictionary (such as a dictionary with a maximum length base of 9) may be utilized, while maintaining fidelity. This may greatly reduce the complexity, calculations, and consequently the computational cost, as well as other costs, without sacrificing fidelity. As discussed above the maximum length of the bases is one aspect of the relatively low complexity dictionary. Another aspect is the reduced number of bases in the dictionary.

For compression, the matching pursuits process may be terminated at some stage and the codes of a determined number of Atoms are stored and/or transmitted by a further coding process. Alternatively, it may be terminated when the error in encoding has been reduced to a desired level. For one embodiment, the further coding process may be a lossless coding process. Other embodiments may use other coding techniques, including non-lossless coding techniques.

An enhanced, final, and/or optimal bases dictionary and/or codebook may be determined by utilizing a candidate dictionary and/or candidate list. The entries of the candidate dictionary and/or list may be utilized, along with an empty or partial final dictionary to code an image. This may be done by considering each entry in the candidate dictionary in turn and forming a codebook from this entry combined with the empty or partial final dictionary. The data is coded, as many times as there are entries in the candidate dictionary, by finding a predetermined number of atoms, or by coding the data to a desired bit rate or to some other threshold. The relative maximum, or substantially maximum, sum of the squares of the inner products determined in selecting the Atoms may be found for each entry in the candidate dictionary and utilized to determine the next relatively best entry in the final dictionary. Furthermore, either the residual error in the data or the signal to noise ratio may be utilized to determine the relatively best candidate for the next inclusion in the final dictionary and/or codebook.

The relatively best candidate may then be removed from the candidate dictionary and placed into an optimal and/or final dictionary and/or codebook. This process is repeated for the remaining entries from the candidate dictionary, utilizing the final dictionary, to similarly find the candidate entry with the next largest, or nearly largest, sum of the squares of the inner product, and/or the candidate with the lowest residual error, and/or the largest signal to noise ratio, and/or when a certain number of atoms is reached, and/or combinations thereof. In this manner, the final dictionary and/or codebook grows by the successive selection of best and/or substantially best candidate bases. This process may be continued until a threshold has been reached, such as a certain number of bases in the final dictionary, and/or where the maximum or nearly maximum inner product is below a predetermined value, and/or when the signal to noise ratio is above a predetermined value, and/or combinations thereof.

The relative or substantially maximum sum of the squares of the inner products may be within the top 10 inner products, top 15% of all inner products calculated, or above a predetermined threshold for the inner product. The substantially optimal or substantially best entry may be the entry with the relative or substantially maximum sum of the squares of the inner products. The candidate dictionary may be optimal in that it contains entries of a small, restricted width, such as 15 or below. The final dictionary may be optimal in that it contains a relatively low number of entries, such as 15 or below. Furthermore, the final dictionary may be substantially optimal in that it may reduce bit rate and/or calculations, and/or increase signal to noise ratio, and/or increase a compression ratio. The final dictionary may not be strictly optimal because to find a fully optimal dictionary of b bases from n candidates would involve trying all nCb combinations for the training data set. This would require geological timescales on even the fastest available computers for realistic dictionary sizes and so may take unrealistic amounts of time. On the other hand, the selection process disclosed herein may deliver substantially optimal dictionaries and/or codebooks in feasible times of a few weeks on ordinary PC computers.

This substantially final dictionary and/or codebook may be used on a signal, or data that has been transformed, such as a wavelet transform. Furthermore, the substantially final dictionary and/or codebook may be utilized to code data with matching pursuits. This process may also be used with other data, including audio, visual, video, multidimensional, and/or non-transformed data. Furthermore, the final, optimal, and or near optimal dictionary may be used to code many different types of transformed and non-transformed data. Yet further, this method and system may be utilized to determine final, optimal, and/or near optimal dictionaries and/or codebooks for many different types of data coding.

An image may be represented as a two-dimensional array of coefficients, each coefficient representing intensity levels at a point. Many images have smooth intensity variations, with the fine details being represented as sharp edges in between the smooth variations. The smooth variations in intensity may be termed as low frequency components and the sharp variations as high frequency components. The low frequency components (smooth variations) may comprise the gross information for an image, and the high frequency components may include information to add detail to the gross information. One technique for separating the low frequency components from the high frequency components may include a Discrete Wavelet Transform (DWT). Wavelet transforms may be used to decompose images, as well as other transforms, such as, but not limited to a displaced frame difference transform to produce a displaced frame difference image. Wavelet decomposition may include the application of Finite Impulse Response (FIR) filters to separate image data into sub sampled frequency bands. The application of the FIR filters may occur in an iterative fashion, in an embodiment.

Turning to the drawings, wherein like reference numerals refer to like elements, the subject of this disclosure may be illustrated as being implemented in a suitable computing environment. Although not required, the invention will be described in the general context of computer-executable instructions, such as program modules, may be executed by a personal computer and/or other computer platform. Generally, program modules include routines, programs, objects, components, data structures, etc. that perform particular tasks or implement particular abstract data types. Moreover, those skilled in the art will appreciate that the invention may be practiced with other computer platforms and/or computer system configurations, including hand-held devices, multi-processor systems, processor based, or programmable consumer electronics, network PCs, minicomputers, mainframe computers, and the like. The invention may also be practiced in distributed computing environments where tasks are performed by remote processing devices that are linked through a communications network. In a distributed computing environment, program modules may be located in both local and remote memory storage devices. Furthermore, a computer program product may include instructions that may be capable of being stored on a computer readable medium. The computer program product may be communicated via a network, such as the Internet.

With reference to FIG. 1, one embodiment of a system for implementing the method may include a general purpose computing device in the form of a computer 20, including a processing unit 21, a system memory 22, and a system bus 23 that may couple various system components including the system memory to the processing unit 21. The system bus 23 may be any of several types of bus structures including a memory bus or memory controller, a peripheral bus, and a local bus among many, which use any of a variety of bus architectures. The system memory may include read only memory (ROM) 24, random access memory (RAM) 25, and/or other memory. A basic input/output system (BIOS) 26, containing the basic routines that may help to transfer information between elements within the personal computer 20, such as during start-up, may be stored in ROM 24. The computer 20 may further include a hard disk drive 27 for reading from, and writing to, a hard disk 60, a magnetic disk drive 28 for reading from, or writing to, a removable magnetic disk 29, and an optical disk drive 30 for reading from, or writing to, a removable optical disk 31 such as a CD ROM or other media.

The hard disk drive 27, magnetic disk drive 28, and optical disk drive 30 may be connected to the system bus 23 by a hard disk drive interface 32, a magnetic disk drive interface 33, and/or an optical disk drive interface 34, respectively. The drives and their associated computer-readable media may provide nonvolatile storage of computer readable instructions, data structures, program modules and other data for computer 20. Although the exemplary environment described herein employs a hard disk 60, a removable magnetic disk 29, and a removable optical disk 31, it will be appreciated that other types of computer readable media which can store data that is accessible by a computer, such as magnetic cassettes, flash memory cards, digital video disks, random access memories, read only memories, and/or the like may also be used in the exemplary operating environment.

A number of program modules may be stored on the hard disk 60, magnetic disk 29, optical disk 31, ROM 24 or RAM 25, including an operating system 35, one or more applications programs 36, other program modules 37, and program data 38. A user may enter commands and information into computer 20 through input devices such as a keyboard 40 and a pointing device 42. Other input devices (not shown) may include a microphone, joystick, game pad, satellite dish, scanner, or the like. These and other input devices may be connected to the processing unit 21 through a serial port interface 46 that may be coupled to the system bus, but may be connected by other interfaces, such as a parallel port, wireless, game port, or a universal serial bus (USB), among other connection types. A monitor 47 or other type of display device may also be connected to the system bus 23 via an interface, such as a video adapter 48. In addition to the monitor, personal computers typically include other peripheral output devices, not shown, such as speakers and printers.

Computer 20 may operate in a networked environment using logical connections to one or more remote computers, such as a remote computer 49. The remote computer 49 may be another personal computer, a server, a router, a network PC, a peer device or other common network node, and typically includes many or all of the elements described above relative to computer 20, although only a memory storage device 50 has been illustrated in FIG. 1. The logical connections depicted in FIG. 1 include a local area network (LAN) 51 and a wide area network (WAN) 52. Other networking systems and interfaces may be used.

When used in a LAN networking environment, computer 20 may be connected to the local network 51 through a network interface or adapter 53. When used in a WAN networking environment, the personal computer 20 may include a modem 54 or other means for establishing communications over the WAN 52. The modem 54, which may be internal or external, may be connected to the system bus 23 via the serial port interface 46. In a networked environment, program modules depicted relative to computer 20, or portions thereof, may be stored in the remote memory storage device. It will be appreciated that the network connections shown are exemplary and other means of establishing a communications link between the computers may be used, including wireless, among many others.

In the description herein, the systems and methods may be described with reference to acts and symbolic representations of operations that are performed by one or more computers. As such, it will be understood that such acts and operations, which are at times referred to as being computer-executed, include the manipulation by the processing unit of the computer of electrical signals representing data in a structured form. This manipulation transforms the data or maintains it at locations in the memory system of the computer, which reconfigures or otherwise alters the operation of the computer in a manner well understood by those skilled in the art. The data structures where data is maintained are physical locations of the memory that may have particular properties defined by the format of the data. However, while the disclosure is being described in the foregoing context, it is not meant to be limiting, as it will be appreciated that various acts and operations described hereinafter may also be implemented in hardware.

Figure 2:
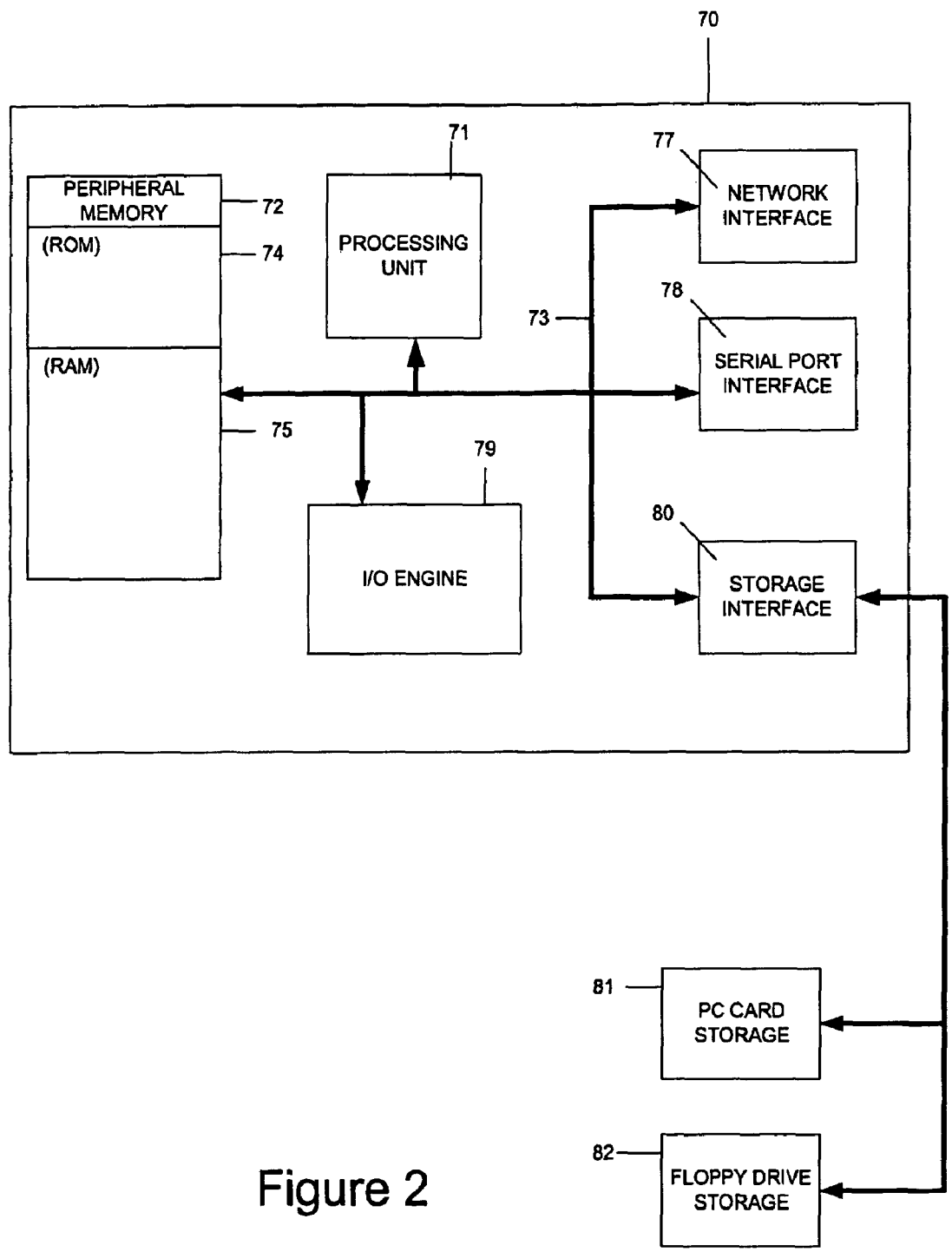
FIG. 2 is a diagram of a system according to an embodiment.

Turning to FIG. 2, an embodiment of an input/output device for implementing the systems and methods may include a general purpose peripheral 70, including a processing unit 71, a peripheral memory 72, and a peripheral bus 73 that may couple various peripheral components including the peripheral memory to the processing unit 71. The peripheral bus 73 may be any of several types of bus structures including a memory bus or memory controller, and a local bus using any of a variety of bus architectures, among many others. The peripheral memory may include read only memory (ROM) 74, random access memory (RAM) 75, and/or other memory.

The peripheral 70 may include a network interface 77, a serial port interface 78, or another type of interface, such as a Universal Serial Bus (USB) interface, a Small Computer System Interface (SCSI), or other interface. Many combinations of such interfaces can also be incorporated. The peripheral 70 also may include an input/output engine 79, which can operate on various principles depending on the nature of the peripheral. For example, a printer peripheral could contain a print engine such as ink jet printing, laser printing, dot matrix printing, daisy-wheel printing, thermal transfer printing, or dye sublimation printing. Alternatively, a scanner peripheral could provide for a scan engine such as negative scanning, flatbed scanning, handheld scanning, or digital photography. The peripheral 70 may also have additional storage, through the storage interface 80. Storage interface 80 may be connected to a PC card reader 81, a floppy drive 82, or any other internal or external storage device.

It will be appreciated that peripheral 70 could be a printer, a fax machine, a copier, a scanner, a digital camera, or other peripheral. The disclosure is not intended to be limited to any one type of peripheral.

Figure 3:
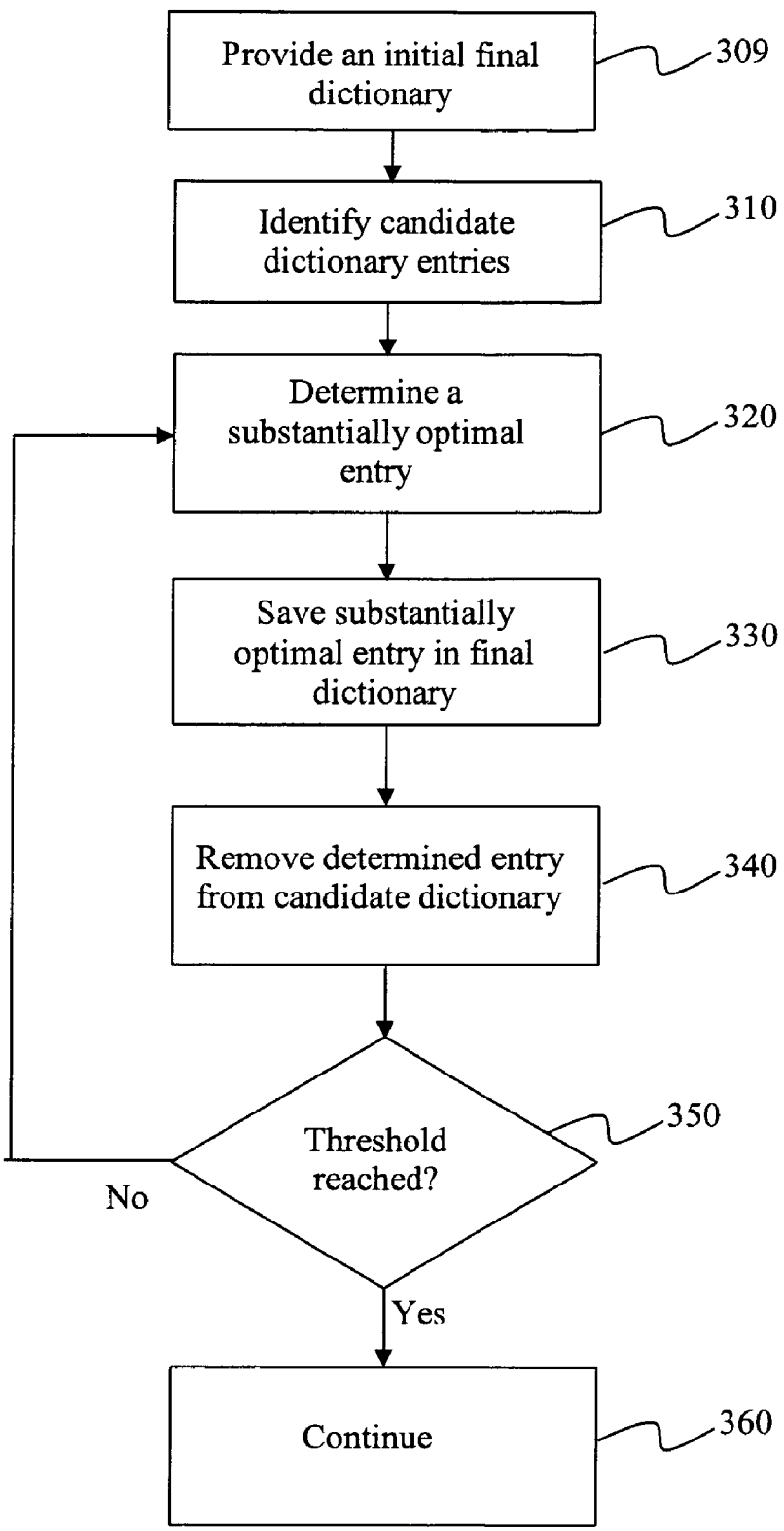
FIG. 3 is a flow diagram of an embodiment of a method for selecting bases.

FIG. 3 is a flow diagram of one embodiment of a method for selecting a bases dictionary for image coding, such as coding utilizing wavelet transforms and matching pursuits. At block 309 an initial final dictionary is provided which may be empty or may contain entries previously determined such as the Dirac function (Unit impulse) which is known to be a generally useful codebook entry for many applications. At block 310, candidate dictionary entries are determined. Many different codebooks, and/or dictionary entries may be utilized within the candidate dictionary, as a starting point for selecting an optimal dictionary set for coding and decoding data. The candidate dictionary selection may depend upon the type of data to be coded. For instance, one set of dictionary entries may be utilized for audio data, and another for images. Similarly, one set of dictionary entries may be utilized for a still image, and another for video images. Other entries may be utilized for other types of data.

At 320, the method may include determining the substantially best and/or optimal entry. This determination may be accomplished by coding a predetermined number of Atoms, or to a desired bit rate for each entry from the candidate dictionary with the signal to be coded and/or a portion of the signal and selecting the entry that gives the substantially best and/or optimal result measured by the sum of squares of the inner products and/or the error in the residual data and/or the signal to noise ratio. In an exemplary embodiment, the data may be transformed, such as by discrete wavelet transform, before coding. In an embodiment, the data may be an image and may comprise a still image (or intra-frame), a motion-compensated residual image (Displaced Frame Difference (DFD) image, or inter-frame), or other type of image or data. The wavelet transform for this example embodiment may comprise a two-dimensional analysis, although the claimed subject matter is not limited in this respect.

The candidate entry with the largest or nearly largest sum of squares of the inner products and/or the largest or nearly largest signal to noise ratio and/or the smallest or substantially smallest error in the residual data may be called the substantially best or optimal entry. This substantially best or optimal entry may then be included in the final and/or optimal dictionary at 330. Furthermore, this substantially best or optimal entry may be removed from the candidate dictionary at 340. This removal may allow the next iteration to determine the $2^{nd}$ best candidate entry, etc.

At 350 if a threshold has been met, the "Yes" leg is followed to Continue at 360. If the threshold has not been met, the "No" leg is followed back to the determining the substantially best or optimal entry at 320. The threshold may be a certain number of entries in the optimal dictionary. It also may be a predetermined sum of magnitudes of the inner product found. It may also be a predetermined residual error in the data. The threshold also may be many other thresholds.

This method may produce a better final dictionary than if the entire candidate dictionary is utilized to code the signal, and the most used entries are put into the "optimal" dictionary. In this "popularity" method, the entries may "compete" with one another thereby reducing their effectiveness. The final dictionary may be better in that it has fewer entries, used more often, and/or reduces compression calculations, and/or bit rate and/or increases compression ratio. Furthermore, the method of this disclosure is not restricted to matching pursuits and may produce a better codebook for virtually any coding method that utilizes a codebook.

Figure 4:
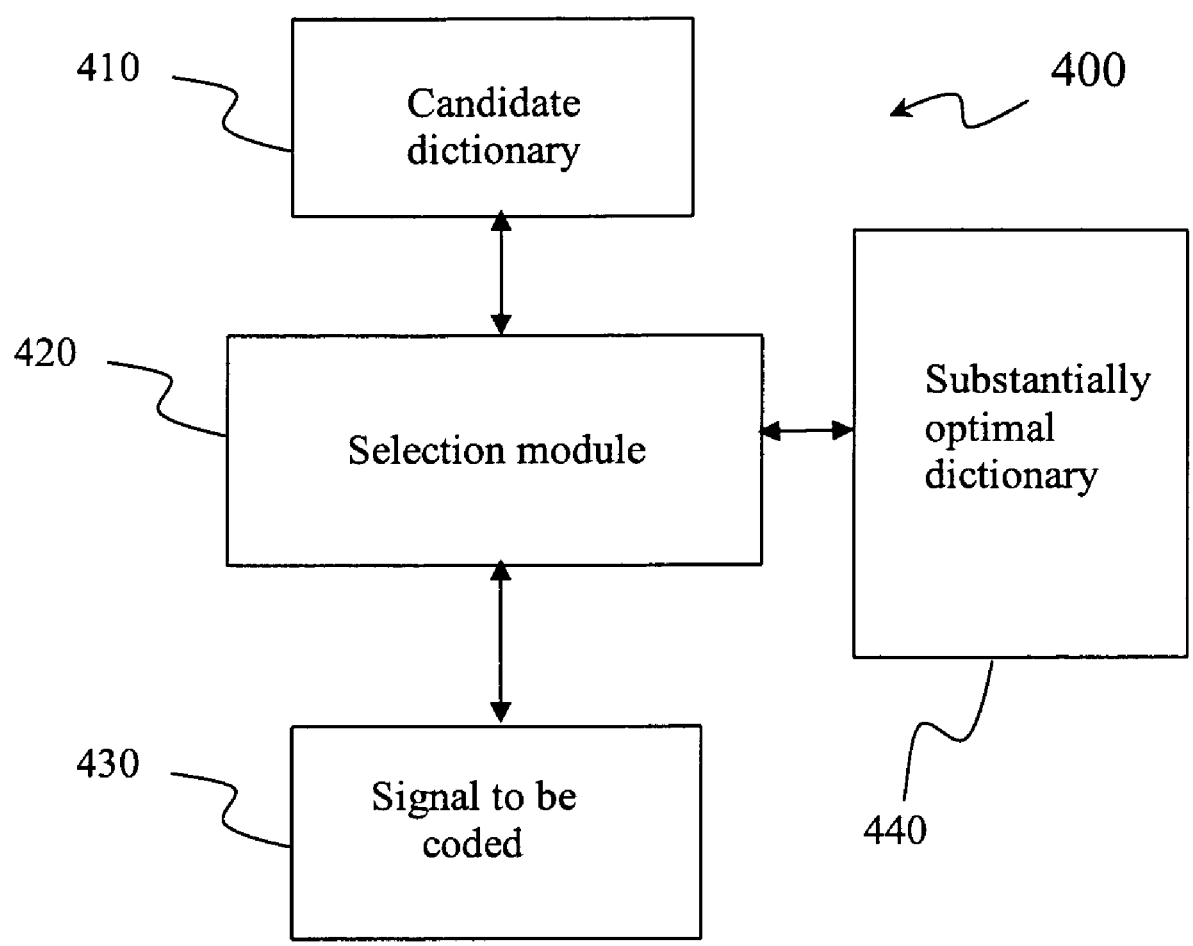
FIG. 4 is a block diagram of an embodiment of an example bases selection system.

FIG. 4 shows a block diagram of an exemplary embodiment of a system, at 400. System 400 may include a candidate dictionary at 410. One design consideration may be which candidate dictionary entries to start with.

A selection module 420 may be configured to receive the entries from the candidate dictionary 410, and form a codebook by combination with the final and/or substantially optimal dictionary 440 which is used to code the signal to be coded 430 by selecting Atoms after calculating the inner products between the codebook and the signal to be coded 430. Selection module may then compare all the sums of squares of the inner products and/or the signal to noise ratios to determine the candidate with the largest or relatively large magnitude. Selection module may alternatively compare all the errors in the residual data to determine the candidate with the smallest or relatively smallest magnitude.

The entry that produces the substantially best magnitude may then be identified as the substantially best or optimal entry. This substantially best or optimal entry may then be saved to a final and/or substantially optimal dictionary 440. The substantially best or optimal entry may then be removed from the candidate dictionary 410. Selection module 420 may then again code the data and calculate the largest or nearly largest sum of squares of the inner products and/or the largest or nearly largest signal to noise ratio and/or the smallest or substantially smallest error in the residual data for the remaining candidate entries and find the best of the remaining entries. This process may be repeated until the threshold has been met.

An enhanced, final, and/or optimal bases dictionary may be determined by utilizing a candidate dictionary. The entries of the candidate dictionary may be utilized, along with a portion of a signal to be coded to find the best or substantially best entry in the candidate dictionary. The entry with the largest or nearly largest sum of squares of the inner products and/or the largest or nearly largest signal to noise ratio and/or the smallest or substantially smallest error in the residual data may be called the substantially best or optimal entry which may then be removed from the candidate dictionary and placed into an optimal and/or final dictionary. The largest or nearly largest sum of squares of the inner products and/or the largest or nearly largest signal to noise ratio and/or the smallest or substantially smallest error in the residual data may be calculated similarly to find the next best or substantially nest best entry. This process may be continued until a threshold has been reached, such as a certain number of bases in the final dictionary, or where the largest or nearly largest sum of squares of the inner products product is below a predetermined value and/or the largest or nearly largest signal to noise ratio is above a predetermined value and/or the smallest or substantially smallest error in the residual data is below a predetermined level, and/or combinations thereof.

This final dictionary may be used on a signal, or data that has been transformed, such as a wavelet transform. Furthermore, the final dictionary may be utilized to code data with matching pursuits. This process may also be used with other data, including audio, visual, video, multidimensional, and/or non-transformed data. Furthermore, the final, optimal, and or near optimal dictionary may be used to code many different types of transformed and non-transformed data. Yet further, this method and system may be utilized to determine final, optimal, and or near optimal dictionaries and/or codebooks for many different types of data coding.

Reference in the specification to "an embodiment", "one embodiment", "some embodiments", or "other embodiments" means that a particular feature, structure, or characteristic described in connection with the embodiments is included in at least some embodiments, but not necessarily all embodiments. The various appearances of "an embodiment", "one embodiment", or "some embodiments" are not necessarily all referring to the same embodiments.

In the specification herein, claimed subject matter has been described with reference to specific example embodiments thereof. However, it will be evident that various modifications and/or changes may be made thereto without departing from the broader spirit and/or scope of the subject matter as set forth in the appended claims. The specification and/or drawings are, accordingly, to be regarded in an illustrative rather than in a restrictive sense.

Some portions of the detailed description herein are presented in terms of processes, programs and/or symbolic representations of operations on data bits and/or binary digital signals within a computer memory, for example. These algorithmic descriptions and/or representations may include techniques used in the data processing arts to convey the arrangement of a computer system and/or other information handling system to operate according to such programs, processes, and/or symbolic representations of operations.

A process may be generally considered to be a self-consistent sequence of acts and/or operations leading to a desired result. These include physical manipulations of physical quantities. Usually, though not necessarily, these quantities take the form of electrical and/or magnetic signals capable of being stored, transferred, combined, compared, and/or otherwise manipulated. It may be convenient at times, principally for reasons of common usage, to refer to these signals as bits, values, elements, symbols, characters, terms, numbers and/or the like. However, these and/or similar terms may be associated with the appropriate physical quantities, and are merely convenient labels applied to these quantities.

Unless specifically stated otherwise, as apparent from the discussions herein, throughout the specification discussion utilizing terms such as processing, computing, calculating, determining, and/or the like, refer to the action and/or processes of a computing platform such as computer and/or computing system, and/or similar electronic computing device, that manipulate and/or transform data represented as physical, such as electronic, quantities within the registers and/or memories of the computer and/or computing system and/or similar electronic and/or computing device into other data similarly represented as physical quantities within the memories, registers and/or other such information storage, transmission and/or display devices of the computing system and/or other information handling system.

Embodiments claimed may include one or more apparatuses for performing the operations herein. Such an apparatus may be specially constructed for the desired purposes, or it may comprise a general purpose computing device selectively activated and/or reconfigured by a program stored in the device. Such a program may be stored on a storage medium, such as, but not limited to, any type of disk including floppy disks, optical disks, CD-ROMs, magnetic-optical disks, read-only memories (ROMs), random access memories (RAMs), electrically programmable read-only memories (EPROMs), electrically erasable and/or programmable read only memories (EEPROMs), flash memory, magnetic and/or optical cards, and/or any other type of media suitable for storing electronic instructions, and/or capable of being coupled to a system bus for a computing device, computing platform, and/or other information handling system. However, the computer program product may also be capable of being downloaded directly to the computing device, such as, but not limited to, a download over the Internet. This disclosure is intended to cover this carrier wave format.

The processes and/or displays presented herein are not inherently related to any particular computing device and/or other apparatus. Various general purpose systems may be used with programs in accordance with the teachings herein, or a more specialized apparatus may be constructed to perform the desired method. The desired structure for a variety of these systems will appear from the description below. In addition, embodiments are not described with reference to any particular programming language. It will be appreciated that a variety of programming languages may be used to implement the teachings described herein.

In the description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

What is claimed is:

1. A method performed by a computing system having a processor, comprising:
   identifying by the processor an entry from a bases dictionary for signal coding comprising a plurality of entries, each entry comprising a base function having a width of 14 or less samples; and
   utilizing the identified entry in a low complexity matching pursuits data coding.

2. The method of claim 1, wherein the bases dictionary comprises an entry comprising a base defined at least in part by a width of 1, a frequency of 0, a phase of 0, and an attenuation of 1.

3. The method of claim 1, wherein the bases dictionary comprises an entry comprising a base defined at least in part by a width of 5, a frequency of 0, a phase of 0, and an attenuation of 8.

4. The method of claim 1, wherein the bases dictionary comprises an entry comprising a base defined at least in part by a width of 9, a frequency of 3, a phase of 1.5, and an attenuation of 2.

5. The method of claim 1, wherein the bases dictionary comprises an entry comprising a base defined at least in part by a width of 9, a frequency of 0, a phase of 0, and an attenuation of 24.

6. The method of claim 1, wherein the bases dictionary comprises an entry comprising a base defined at least in part by a width of 9, a frequency of 1, a phase of 1, and an attenuation of 2.

7. The method of claim 1, wherein the bases dictionary comprises an entry comprising a base defined at least in part by a width of 3, a frequency of 1, a phase of 0, and an attenuation of 2.

8. The method of claim 1, wherein the bases dictionary comprises an entry comprising a base defined at least in part by a width of 5, a frequency of 1, a phase of 2, and an attenuation of 1.

9. The method of claim 1, wherein the bases dictionary comprises an entry comprising a base defined at least in part by a width of 3, a frequency of 0, a phase of 0, and an attenuation of 12.

10. The method of claim 1, wherein the bases dictionary comprises an entry comprising a base defined at least in part by a width of 7, a frequency of 2, a phase of 1.5, and an attenuation of 12.

11. The method of claim 1, wherein the bases dictionary comprises an entry comprising a base defined at least in part by a width of 7, a frequency of 1, a phase of 1.5, and an attenuation of 4.

12. The method of claim 1, wherein the bases dictionary comprises an entry comprising a base defined at least in part by a width of 7, a frequency of 0, a phase of 0, and an attenuation of 12.

13. The method of claim 1, wherein the bases dictionary comprises an entry comprising a base defined at least in part by a width of 5, a frequency of 2, a phase of 0, and an attenuation of 12.

14. The method of claim 1, wherein the bases dictionary comprises an entry comprising a base defined at least in part by a width of 9, a frequency of 1, a phase of 2, and an attenuation of 8.

15. The method of claim 1, wherein the bases dictionary comprises an entry comprising a base defined at least in part by a width of 5, a frequency of 1, a phase of 1, and an attenuation of 24.

16. The method of claim 1, wherein the bases dictionary comprises an entry comprising a base defined at least in part by a width of 5, a frequency of 1, a phase of 0, and an attenuation of 12.

17. The method of claim 1, wherein the bases dictionary comprises an entry comprising a base defined at least in part by a width of 9, a frequency of 3, a phase of 1, and an attenuation of 2.

18. The method of claim 1, wherein the bases dictionary comprises an entry comprising a base derived at least in part from one of the following bases:
   a width of 1, a frequency of 0, a phase of 0, and an attenuation of 1;
   a width of 5, a frequency of 0, a phase of 0, and an attenuation of 8;
   a width of 9, a frequency of 3, a phase of 1.5, and an attenuation of 2;
   a width of 9, a frequency of 0, a phase of 0, and an attenuation of 24;
   a width of 9, a frequency of 1, a phase of 1, and an attenuation of 2;
   a width of 3, a frequency of 1, a phase of 0, and an attenuation of 2;
   a width of 5, a frequency of 1, a phase of 2, and an attenuation of 1;
   a width of 3, a frequency of 0, a phase of 0, and an attenuation of 12;
   a width of 7, a frequency of 2, a phase of 1.5, and an attenuation of 12;
   a width of 7, a frequency of 1, a phase of 1.5, and an attenuation of 4;
   a width of 5, a frequency of 2, a phase of 0, and an attenuation of 12;
   a width of 9, a frequency of 1, a phase of 2, and an attenuation of 8;
   a width of 5, a frequency of 1, a phase of 1, and an attenuation of 24;
   a width of 5, a frequency of 1, a phase of 0, and an attenuation of 12; and
   a width of 9, a frequency of 3, a phase of 1, and an attenuation of 2.

19. The method of claim 1, wherein the bases dictionary comprises an entry comprising a base derived at least in part from a second entry other than the determined optimal entry.

20. A system, comprising:
   a processor and memory;
   a bases dictionary for signal coding comprising a plurality of entries, each entry comprising a base function having a width of 14 or less samples;
   a signal to be coded; and
   a selection module configured to receive at least one of the plurality of entries from the bases dictionary, to calculate an inner product between the at least one of the plurality of entries and the signal to be coded, and to select the entry from the at least one of the plurality of entries that produces a maximum inner product for use in at least partially coding the signal to be coded.

21. The system of claim 20, wherein the signal to be coded is a wavelet transformed signal.

22. The system of claim 20, wherein the bases dictionary comprises a base defined at least in part by a width of 1, a frequency of 0, a phase of 0, and an attenuation of 1.

23. The system of claim 20, wherein the bases dictionary comprises a base defined at least in part by a width of 5, a frequency of 0, a phase of 0, and an attenuation of 8.

24. The system of claim 20, wherein the bases dictionary comprises a base defined at least in part by a width of 9, a frequency of 3, a phase of 1.5, and an attenuation of 2.

25. The system of claim 20, wherein the bases dictionary comprises a base defined at least in part by a width of 9, a frequency of 0, a phase of 0, and an attenuation of 24.

26. The system of claim 20, wherein the bases dictionary comprises a base defined at least in part by a width of 9, a frequency of 1, a phase of 1, and an attenuation of 2.

27. The system of claim 20, wherein the bases dictionary comprises a base defined at least in part by a width of 3, a frequency of 1, a phase of 0, and an attenuation of 2.

28. The system of claim 20, wherein the bases dictionary comprises a base derived at least in part from one of the following bases:
   a width of 1, a frequency of 0, a phase of 0, and an attenuation of 1;
   a width of 5, a frequency of 0, a phase of 0, and an attenuation of 8;
   a width of 9, a frequency of 3, a phase of 1.5, and an attenuation of 2;
   a width of 9, a frequency of 0, a phase of 0, and an attenuation of 24;
   a width of 9, a frequency of 1, a phase of 1, and an attenuation of 2;
   a width of 3, a frequency of 1, a phase of 0, and an attenuation of 2;
   a width of 5, a frequency of 1, a phase of 2, and an attenuation of 1;
   a width of 3, a frequency of 0, a phase of 0, and an attenuation of 12;
   a width of 7, a frequency of 2, a phase of 1.5, and an attenuation of 12;
   a width of 7, a frequency of 1, a phase of 1.5, and an attenuation of 4;
   a width of 5, a frequency of 2, a phase of 0, and an attenuation of 12;
   a width of 9, a frequency of 1, a phase of 2, and an attenuation of 8;
   a width of 5, a frequency of 1, a phase of 1, and an attenuation of 24;
   a width of 5, a frequency of 1, a phase of 0, and an attenuation of 12; and
   a width of 9, a frequency of 3, a phase of 1, and an attenuation of 2.

29. The system of claim 20, wherein the bases dictionary comprises a base derived at least in part from another entry in the bases dictionary.

30. A computer-readable storage medium storing computer-executable instructions that, if executed by a computing system, perform a method for selecting a bases dictionary by:
   identifying an entry from a bases dictionary for signal coding comprising a plurality of entries, each entry comprising a base function having a width of 14 or less samples;
   determining whether the identified entry comprises an optimal bases dictionary entry; and
   coding at least a portion of a signal to be coded with the optimal bases dictionary entry.

31. The computer-readable storage medium of claim 30, wherein the bases dictionary comprises an entry defined at least in part by a width of 1, a frequency of 0, a phase of 0, and an attenuation of 1.

32. The computer-readable storage medium of claim 30, wherein the bases dictionary comprises an entry defined at least in part by a width of 5, a frequency of 0, a phase of 0, and an attenuation of 8.

33. The computer-readable storage medium of claim 30, wherein the bases dictionary comprises an entry defined at least in part by a width of 9, a frequency of 3, a phase of 1.5, and an attenuation of 2.

34. The computer-readable storage medium of claim 30, wherein the bases dictionary comprises an entry defined at least in part by a width of 9, a frequency of 0, a phase of 0, and an attenuation of 24.

35. The computer-readable storage medium of claim 30, wherein the bases dictionary comprises an entry defined at least in part by a width of 9, a frequency of 1, a phase of 1, and an attenuation of 2.

36. The computer-readable storage medium of claim 30, wherein the bases dictionary comprises an entry defined at least in part by a width of 3, a frequency of 1, a phase of 0, and an attenuation of 2.

37. The computer-readable storage medium of claim 30, wherein the bases dictionary comprises an entry defined at least in part by a width of 5, a frequency of 1, a phase of 2, and an attenuation of 1.

38. The computer-readable storage medium of claim 30, wherein the bases dictionary comprises an entry defined at least in part by a width of 3, a frequency of 0, a phase of 0, and an attenuation of 12.

39. The computer-readable storage medium of claim 30, wherein the bases dictionary comprises an entry substantially similar to one of the following bases:
   a width of 1, a frequency of 0, a phase of 0, and an attenuation of 1;
   a width of 5, a frequency of 0, a phase of 0, and an attenuation of 8;
   a width of 9, a frequency of 3, a phase of 1.5, and an attenuation of 2;
   a width of 9, a frequency of 0, a phase of 0, and an attenuation of 24;
   a width of 9, a frequency of 1, a phase of 1, and an attenuation of 2;
   a width of 3, a frequency of 1, a phase of 0, and an attenuation of 2;
   a width of 5, a frequency of 1, a phase of 2, and an attenuation of 1;
   a width of 3, a frequency of 0, a phase of 0, and an attenuation of 12;
   a width of 7, a frequency of 2, a phase of 1.5, and an attenuation of 12;
   a width of 7, a frequency of 1, a phase of 1.5, and an attenuation of 4;
   a width of 5, a frequency of 2, a phase of 0, and an attenuation of 12;
   a width of 9, a frequency of 1, a phase of 2, and an attenuation of 8;
   a width of 5, a frequency of 1, a phase of 1, and an attenuation of 24;
   a width of 5, a frequency of 1, a phase of 0, and an attenuation of 12; and
   a width of 9, a frequency of 3, a phase of 1, and an attenuation of 2.

40. The computer-readable storage medium of claim 30, wherein the bases dictionary comprises an entry derived at least in part from a second entry other than the optimal entry.

41. An apparatus, comprising:
    means for identifying an entry from a bases dictionary for signal coding comprising a plurality of entries, each entry comprising a base function having a width of 14 or less samples; and
    means for utilizing the identified entry in a low complexity matching pursuits data coding.

* * * * *

UNITED STATES PATENT AND TRADEMARK OFFICE
CERTIFICATE OF CORRECTION

| | |
|---|---|
| PATENT NO. | : 8,121,848 B2 |
| APPLICATION NO. | : 11/378662 |
| DATED | : February 21, 2012 |
| INVENTOR(S) | : Monro |

Page 1 of 1

It is certified that error appears in the above-identified patent and that said Letters Patent is hereby corrected as shown below:

Page 2, item (56), under "Other Publications", in Column 1, Line 6, delete "vol. 2, no., pp." and insert -- vol. 2, pp. --.

Page 3, item (56), under "Other Publications", in Column 1, Line 7, delete "on Chicago," and insert -- on, Chicago, --.

Signed and Sealed this
Fourteenth Day of August, 2012

David J. Kappos
*Director of the United States Patent and Trademark Office*